US009805971B2

(12) United States Patent
Li et al.

(10) Patent No.: US 9,805,971 B2
(45) Date of Patent: Oct. 31, 2017

(54) METHOD OF FORMING A VIA CONTACT

(71) Applicant: GLOBALFOUNDRIES Singapore Pte. Ltd., Singapore (SG)

(72) Inventors: Rui Li, Singapore (SG); Chin Chuan Neo, Singapore (SG); Hai Cong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/658,261

(22) Filed: Mar. 16, 2015

(65) Prior Publication Data

US 2016/0276213 A1    Sep. 22, 2016

(51) Int. Cl.
  *H01L 21/768* (2006.01)
  *H01L 21/311* (2006.01)
  *H01L 21/8234* (2006.01)

(52) U.S. Cl.
  CPC .. *H01L 21/76804* (2013.01); *H01L 21/31116* (2013.01); *H01L 21/31138* (2013.01); *H01L 21/31144* (2013.01); *H01L 21/76805* (2013.01); *H01L 21/823475* (2013.01); *H01L 21/76897* (2013.01)

(58) Field of Classification Search
  CPC ......... H01L 21/76804; H01L 21/31116; H01L 21/823475; H01L 21/31144
  See application file for complete search history.

(56) References Cited

U.S. PATENT DOCUMENTS

| 6,261,947 B1* | 7/2001 | McTeer | H01L 21/31116 |
| | | | 257/E21.252 |
| 6,731,008 B1* | 5/2004 | Tomita | H01L 21/76897 |
| | | | 257/296 |
| 6,878,622 B1* | 4/2005 | Yang | H01L 21/76897 |
| | | | 257/E21.029 |
| 7,456,097 B1* | 11/2008 | Hill | H01L 21/76804 |
| | | | 257/E21.577 |
| 8,609,529 B2 | 12/2013 | Lin et al. | |
| 2014/0210087 A1 | 7/2014 | Kang | |
| 2015/0079774 A1* | 3/2015 | Chang | H01L 21/76816 |
| | | | 438/586 |
| 2015/0332963 A1* | 11/2015 | Wu | H01L 21/76804 |
| | | | 438/668 |

* cited by examiner

*Primary Examiner* — Selim Ahmed
(74) *Attorney, Agent, or Firm* — Horizon IP PTE Ltd.

(57) ABSTRACT

Semiconductor device and method for forming a semiconductor device are presented. The method includes providing a substrate having a device component with a contact region. A contact dielectric layer is formed on the substrate. The contact dielectric layer covers the substrate and device component. At least one contact opening is formed through the contact dielectric layer. Upper portion of the contact opening includes wider opening with tapered sidewall profile while lower portion of the contact opening includes narrower opening with vertical sidewall profile.

20 Claims, 13 Drawing Sheets

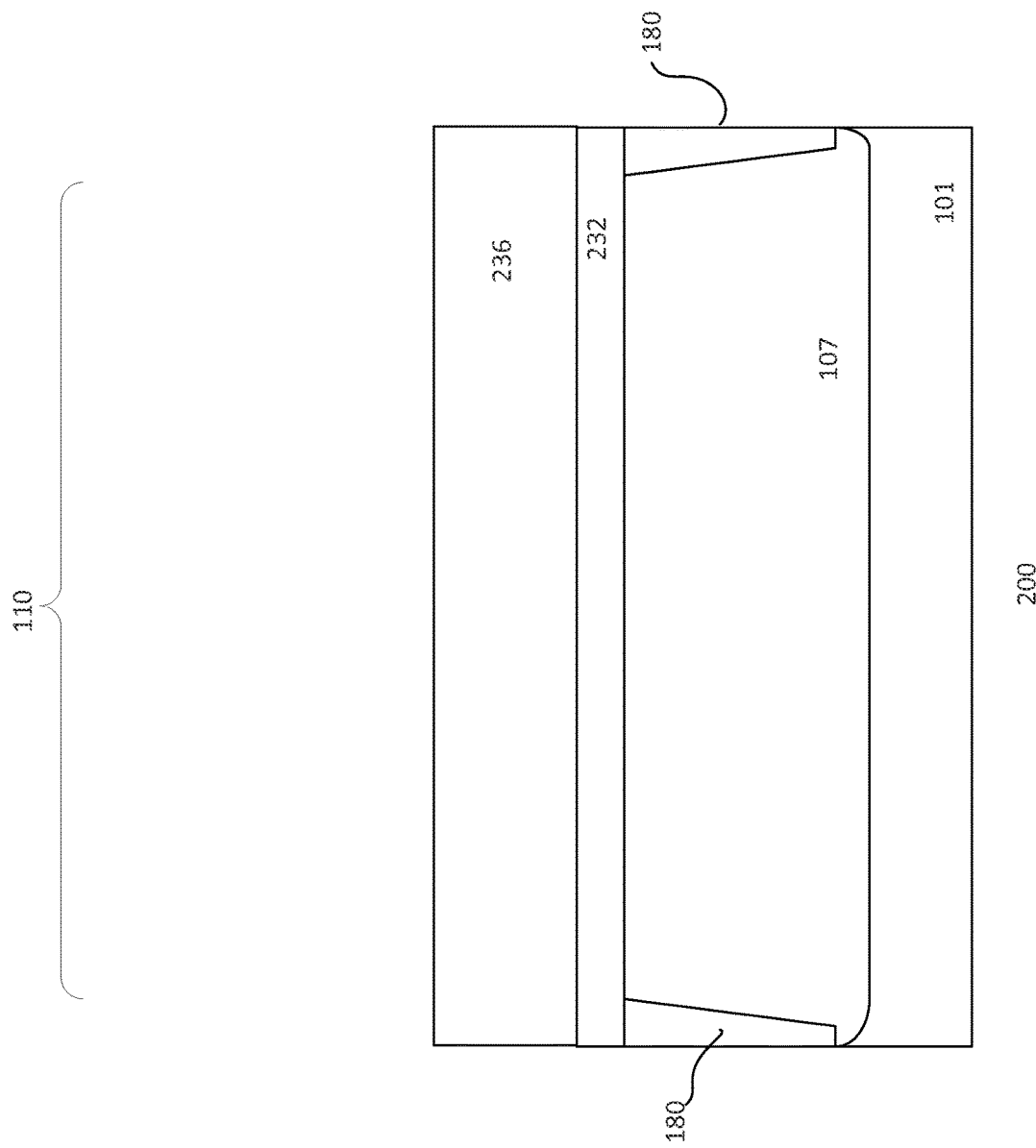

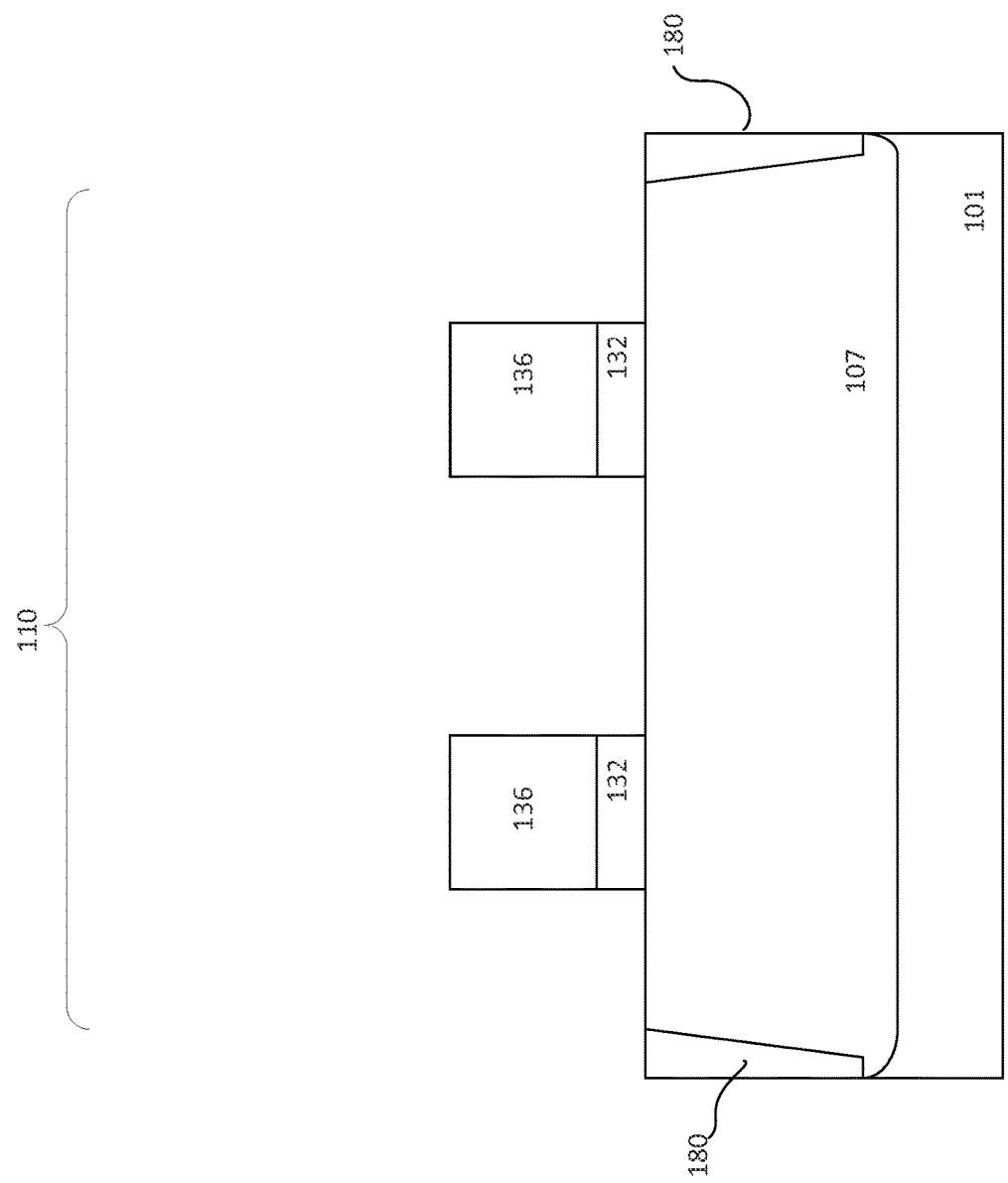

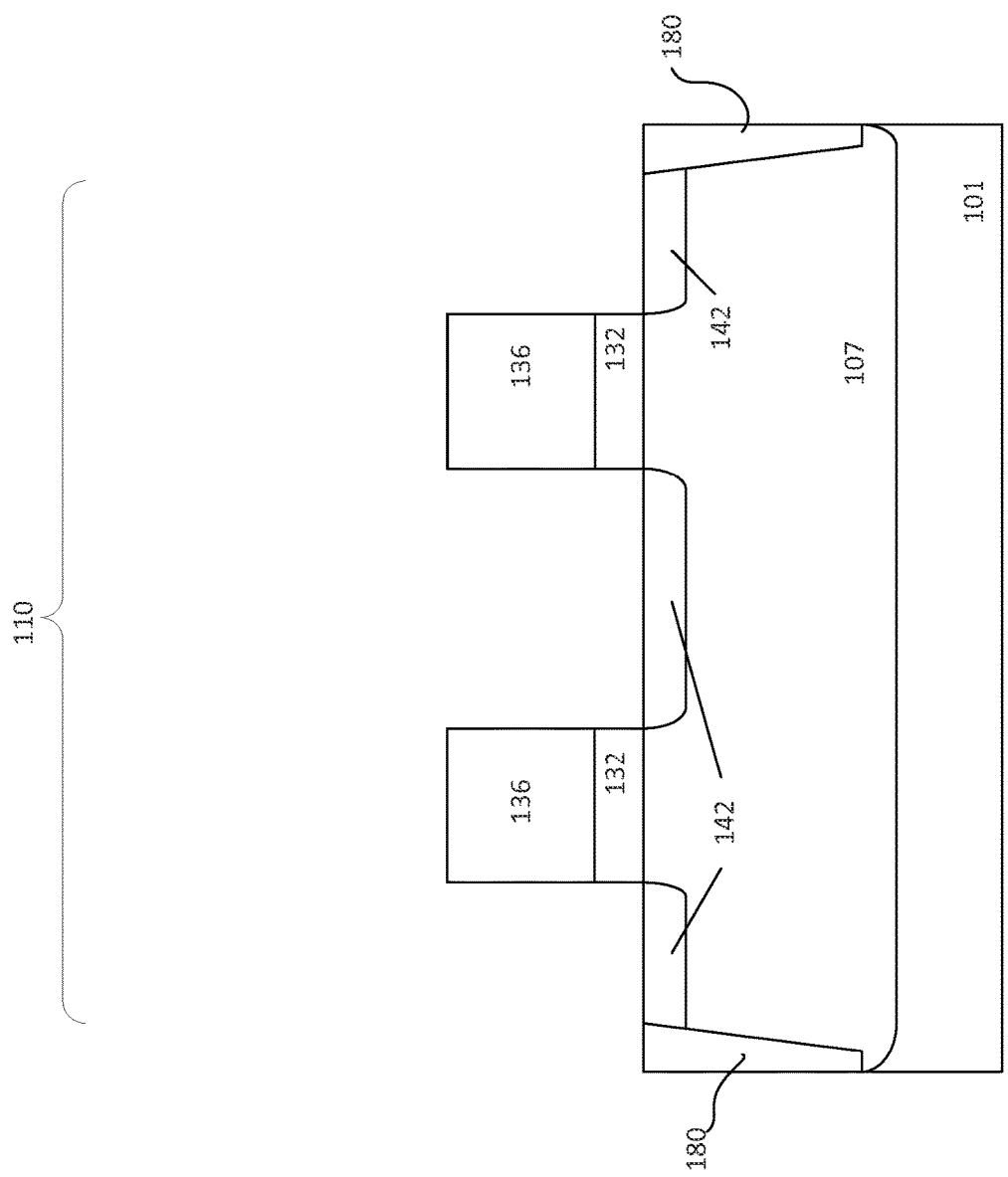

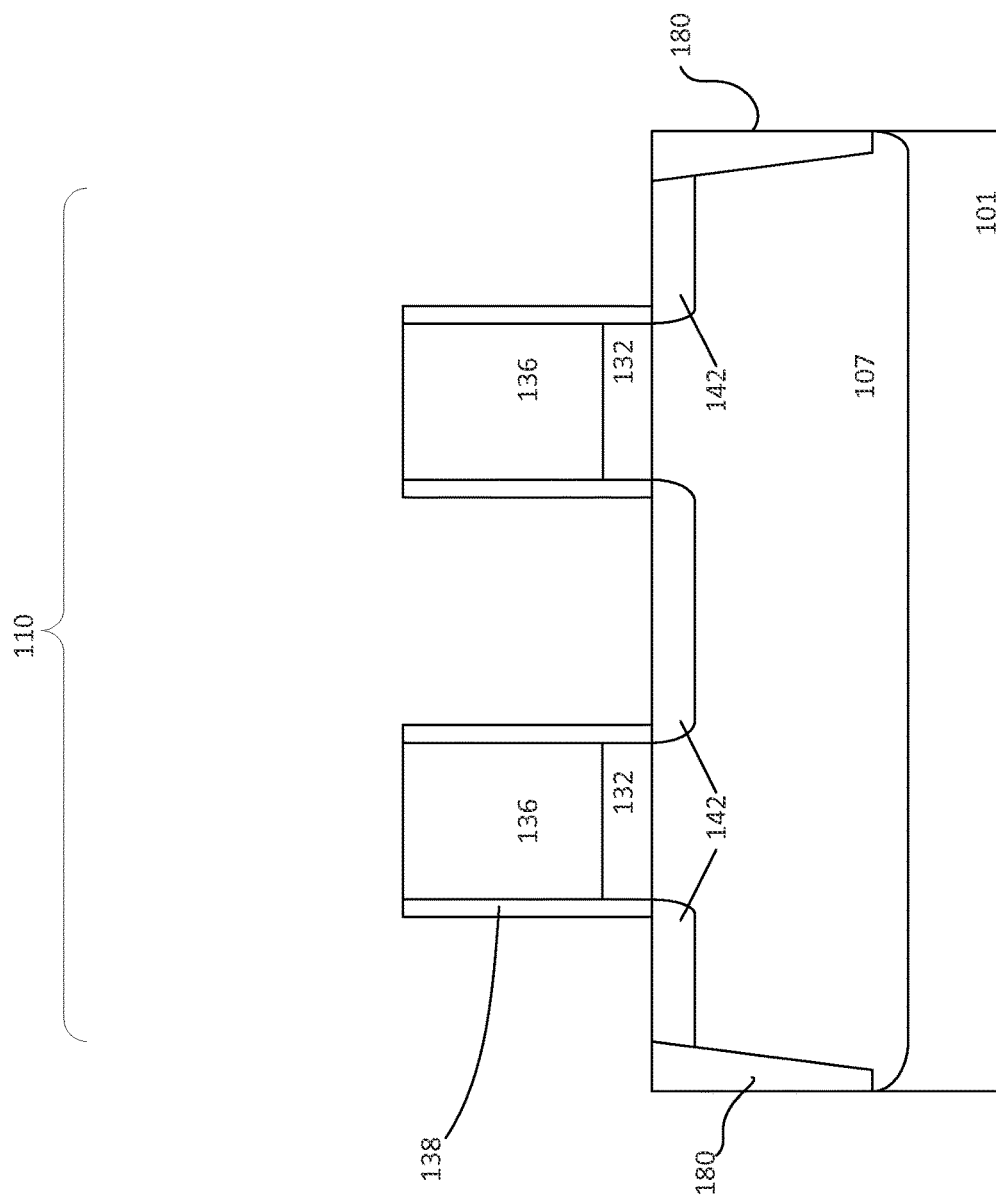

METHOD OF FORMING A VIA CONTACT

BACKGROUND

The fabrication of integrated circuits (ICs) involves the formation of features on a substrate that make up circuit components, such as transistors, resistors and capacitors. The circuit components are interconnected, enabling the IC to perform the desired functions. Interconnections are formed by, for example, forming via contacts in a dielectric layer. The contact in the dielectric layer serves to connect a circuit component to upper interconnections for connecting the circuit component to, for example, other circuit components.

It is important to provide contacts which are devoid of any defects. Contacts with defects, such as presence of seams in conductive contacts including tungsten seam, may adversely render the IC malfunction due to contact open.

From the foregoing discussion, it is desirable to provide a device which is devoid of the above-mentioned problem, thus increasing the reliability of the IC. It is also desirable to provide a simplified process for forming a device with increased reliability.

SUMMARY

Embodiments generally relate to semiconductor devices or integrated circuits (ICs) and methods for forming the semiconductor devices. In one embodiment, a method of forming a device is disclosed. The method includes providing a substrate having a device component with a contact region. A contact dielectric layer is formed on the substrate. The contact dielectric layer covers the substrate and device component. At least one contact opening is formed through the contact dielectric layer. Upper portion of the contact opening includes wider opening with tapered sidewall profile while lower portion of the contact opening includes narrower opening with vertical sidewall profile.

In yet another embodiment, a method of forming a device is presented. The method includes providing a substrate prepared with a transistor having at least one contact region. A contact dielectric layer is formed on the substrate. The contact dielectric layer covers the substrate and transistor. At least one contact opening is formed through the contact dielectric layer. Upper portion of the contact opening includes wider opening with tapered sidewall profile while lower portion of the contact opening includes narrower opening with vertical sidewall profile.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2l show cross-sectional views of an embodiment of a process for forming a device.

DETAILED DESCRIPTION

Embodiments generally relate to semiconductor devices or integrated circuits (ICs). More particularly, some embodiments relate to contacts for interconnecting circuit components, such as transistors in devices. The devices may include other types of circuit components. The devices or ICs can be incorporated into or used with, for example, consumer electronic products, and particularly portable consumer products such as, for example, mobile phones, tablets, and PDAs.

Figure 1:
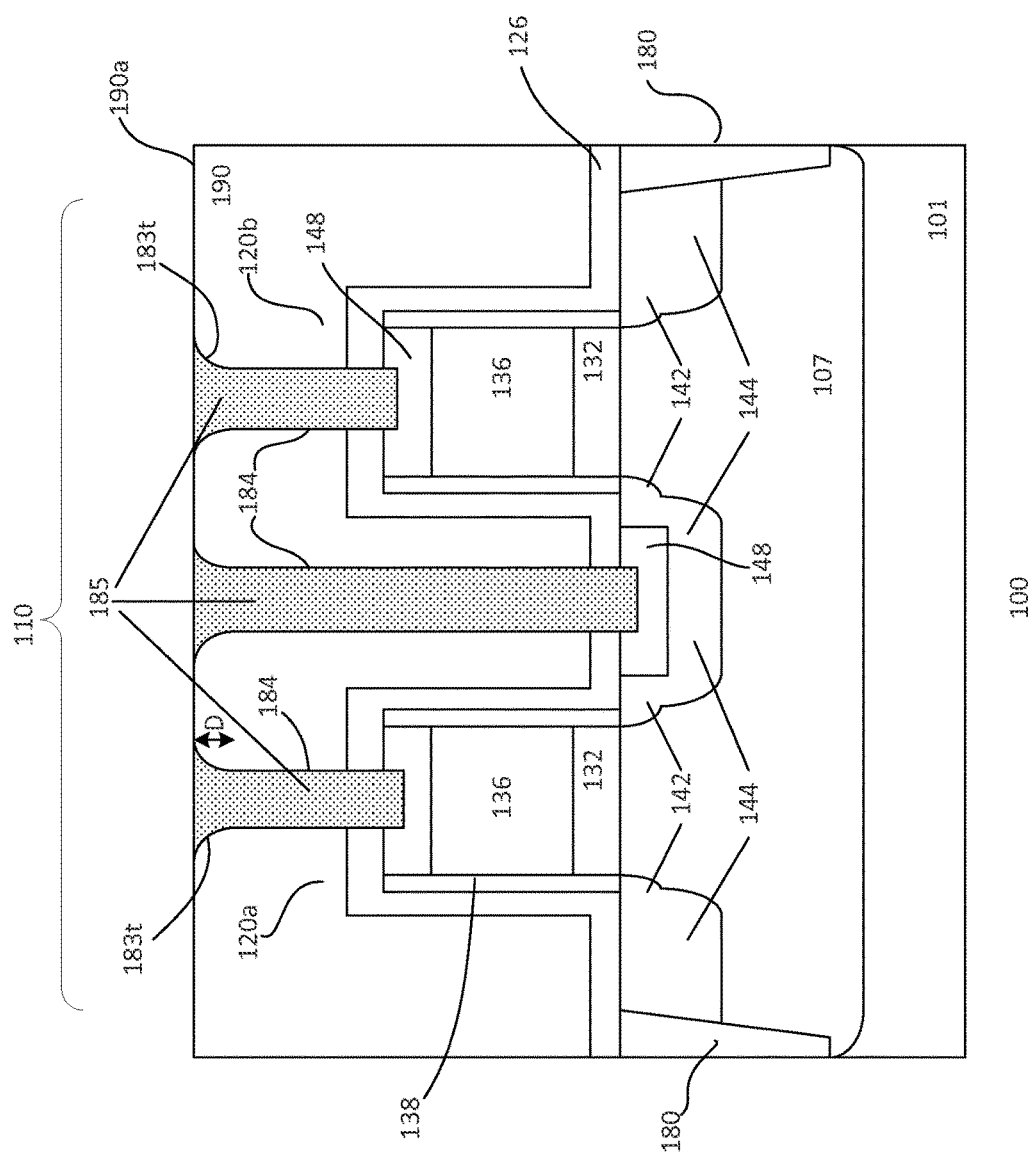
FIG. 1 shows cross-sectional view of an embodiment of a portion of a device.

FIG. 1 shows a cross-sectional view of a portion of an embodiment of a device 100. The device, for example, is an IC. Other types of devices may also be useful. As shown, the device includes a substrate 101. The substrate, for example, is a silicon substrate. Other suitable types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E11$-$1E13/cm^2$, an intermediately doped region may have a dopant concentration of about $1E13$-$1E15/cm^2$, and a heavily doped region may have a dopant concentration of about $1E15$-$1E17/cm^2$. Providing other dopant concentrations for the different types of doped regions may also be useful. For example, the ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

The substrate includes a device region 110. Although one device region is shown, it is understood that the substrate may include other device regions. Isolation regions 180 may be provided for isolating or separating different regions of the substrate. In one embodiment, the device region is isolated from other regions (not shown) by isolation regions 180. For example, an isolation region surrounds a device region. The isolation regions, for example, are shallow trench isolation (STI) regions. Other suitable types of isolation regions may also be employed. For example, the isolation regions may be deep trench isolation (DTI) regions. The STI regions, for example, extend to a depth of about 2000-5000 Å. Providing isolation regions which extend to other depths may also be useful.

At least one transistor is provided in the device region 110. For illustration purpose, first and second transistors 120a and 120b are provided in the device region. Providing other number of transistors may also be useful. In addition, it is understood that other types of circuit components may also be provided in the device region.

A transistor includes a gate disposed on the substrate between first and second diffusion regions or source/drain (S/D) regions 144 in the substrate. The S/D regions are heavily doped regions having a dopant concentration of, for example, about $1E15$-$1E17/cm^2$. The depth of the S/D regions may be about 0.1-0.4 µm. Lightly doped diffusion (LDD) regions 142 which extend from the S/D regions to under the gate may be provided. The LDD regions are lightly doped regions having dopant concentration of, for example, about $1E11$-$1E13/cm^2$ with a depth of about 0.05-0.3 µm. Providing S/D and LDD regions with other suitable dopant concentrations or depths may also be useful. A first S/D region is disposed on a first side of the gate of the first transistor and a second S/D region is disposed on a second side of the gate of the first transistor 120*a* while a first S/D region is disposed on a first side of the gate of the second transistor and a second S/D region is disposed on a second side of the gate of the second transistor 120*b* which is nearer to the first transistor. As shown, the first and second transistors share a common S/D region. For example, the second S/D region of the first transistor and the second S/D region of the second transistor are common S/D region. It is understood that the first and second transistors need not share a common S/D region.

Dielectric sidewall spacers 138 may be disposed on sidewalls of the gate. The spacers may be used to facilitate forming the S/D and LDD regions. For example, LDD regions are formed without spacers while S/D regions are formed with the spacers.

A device well 107 may be disposed in a device region. The device well is disposed within the isolation region. The dopant concentration of the device well may be light to intermediate. For example, the dopant concentration of the device well may be about $5E12$-$5E13/cm^2$. Other suitable dopant concentration for the device wells may also be useful. A depth of the device well may be about 0.5-5 µm. Other suitable depths for the device well may also be useful. In one embodiment, the device well of a transistor is doped with dopants which are of the opposite polarity as the S/D and LDD regions. For example, if the S/D and LDD regions are doped with n-type dopants, then the device well is a p-type doped well. The device well serves as a body of the transistor.

As for the gate, it includes a gate electrode 136 over a gate dielectric 132. The gate electrode, for example, may be polysilicon. The gate electrode may be about 700-5000 Å thick. Other suitable types of gate electrodes as well as thicknesses may also be useful. As for the gate dielectric, it may be formed of silicon oxide, silicon oxynitride or high-k dielectric. The thickness of the gate dielectric may be, for example, about 10-1000 Å. Other suitable types of gate dielectrics or thicknesses may also be useful.

Metal silicide contacts 148 are formed on the S/D regions and on the gate electrodes of the first and second transistors. The metal silicide contacts, for example, may be nickel-based silicide contacts. Other suitable types of metal silicide contacts may also be useful. For example, the metal silicide contact may be cobalt silicide (CoSi). The silicide contacts may be about 50-500 Å thick. Other suitable thicknesses may also be useful. The metal silicide contacts may be used to reduce contact resistance and facilitate contact to the back-end-of-line (BEOL) metal interconnects.

In one embodiment, the first and second transistors are of the same type. For example, the first and second transistors are p-type or n-type transistors. The S/D and LDD regions of n-type transistors are doped with n-type dopants while p-type transistors have p-type doped S/D and LDD regions. In other embodiments, the first and second transistors may be of opposite type. Other suitable configurations of the transistors may also be useful.

A dielectric etch stop layer 126 may be disposed over the substrate, lining the substrate and transistors. The etch stop layer, for example, is a silicon nitride etch stop layer. Other suitable types of etch stop layer may also be useful. The etch stop layer should have a material which can be selectively removed from a dielectric layer thereover. The etch stop layer facilitates in forming contact plugs to contact regions of the transistor, such as the gate electrode and S/D regions. The thickness of the etch stop layer may be about 100-1000 Å. Other suitable thicknesses may also be useful. In other embodiments, the dielectric etch stop layer may not be formed over the substrate.

A contact dielectric layer or pre-metal dielectric (PMD) layer 190 is disposed over the substrate covering the transistors. For example, the contact dielectric layer 190 covers the etch stop layer 126. The contact dielectric layer serves as a contact level. For example, the contact dielectric layer serves as the first contact or CA level. The contact dielectric layer should be sufficiently thick to accommodate contacts. The contact dielectric layer includes a thickness of about 2000-10000 Å. The thickness of the contact dielectric layer varies, for example, depending on the technology node and design requirements.

The contact dielectric layer 190, for example, may include an oxide material. For example, the contact dielectric layer may include $SiO_2$. Other suitable types of dielectric materials including doped silicon oxide such as fluorinated silicon oxide (FSG), undoped or doped silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials can also be used to form the contact dielectric layer. The contact dielectric layer should have a material which can be selectively removed from the etch stop layer below it.

Contact openings 184 in communication with the contact regions are disposed in the contact dielectric layer. For example, the contact openings are in communication with S/D regions and gates of the transistors. The contact openings, for example, extend from the top surface of the contact dielectric layer 190*a* to top surface of the metal silicide contacts 148 on the contact regions. In some instances, the contact openings may extend from the top surface of the contact dielectric layer and penetrate slightly into the metal silicide contacts such that bottom of the contact opening is slightly below top surface of the metal silicide contacts as shown in FIG. 1.

In one embodiment, the profile of the upper portion 183*t* of the contact opening is different than the profile of the lower portion of the contact opening. The width of the upper portion of the contact opening, for example, is 50-200% wider than the width of the lower portion of the contact opening. Other suitable width dimensions may also be useful. The upper portion having wider opening includes a depth (D) of about, for example, 10-30% of the total depth of the contact opening from the top surface of the contact dielectric layer. Other depth dimensions may also be useful for the upper portion. In one embodiment, the upper portion of the contact opening includes tapered sidewall profile while the lower portion has vertical sidewalls.

Conductive contacts 185 are disposed in the contact openings 184. The contacts, for example, may be formed of tungsten (W). Contacts formed of other suitable conductive materials, such as copper, aluminum, or conductive alloys, may also be useful. The contacts, for example, provide electrical connections between the contact regions below and interconnects (not shown) disposed over the contact dielectric layer. Liners (not shown) are provided to line the sidewalls of the contact openings. The liner is provided to serve as a barrier to prevent diffusion of the material of the conductive contact into the contact dielectric layer. The liner, for example, includes TiN, TaN or a combination thereof. Other suitable types of liner material may also be useful.

As described, the contact openings include upper and lower portions having different sidewall profiles. The upper portion of the contact openings 183t includes a tapered sidewall profile and is wider than the lower portion of the contact opening having vertical sidewall profile. This advantageously enables liner to be easily deposited in the contact opening and ensures that the conductive material of the conductive contact completely fills the contact opening without seams formed in the conductive contact. The configuration of the contact opening facilitates gap fill and effectively prevents issues such as contact open. Thus, the reliability of device is assured and the device failure is avoided.

FIGS. 2a-2l show cross-sectional views of a process 200 for forming a device. The device, for example, is similar to that described in FIG. 1. Common elements may not be described or described in detail.

Figure 2A:
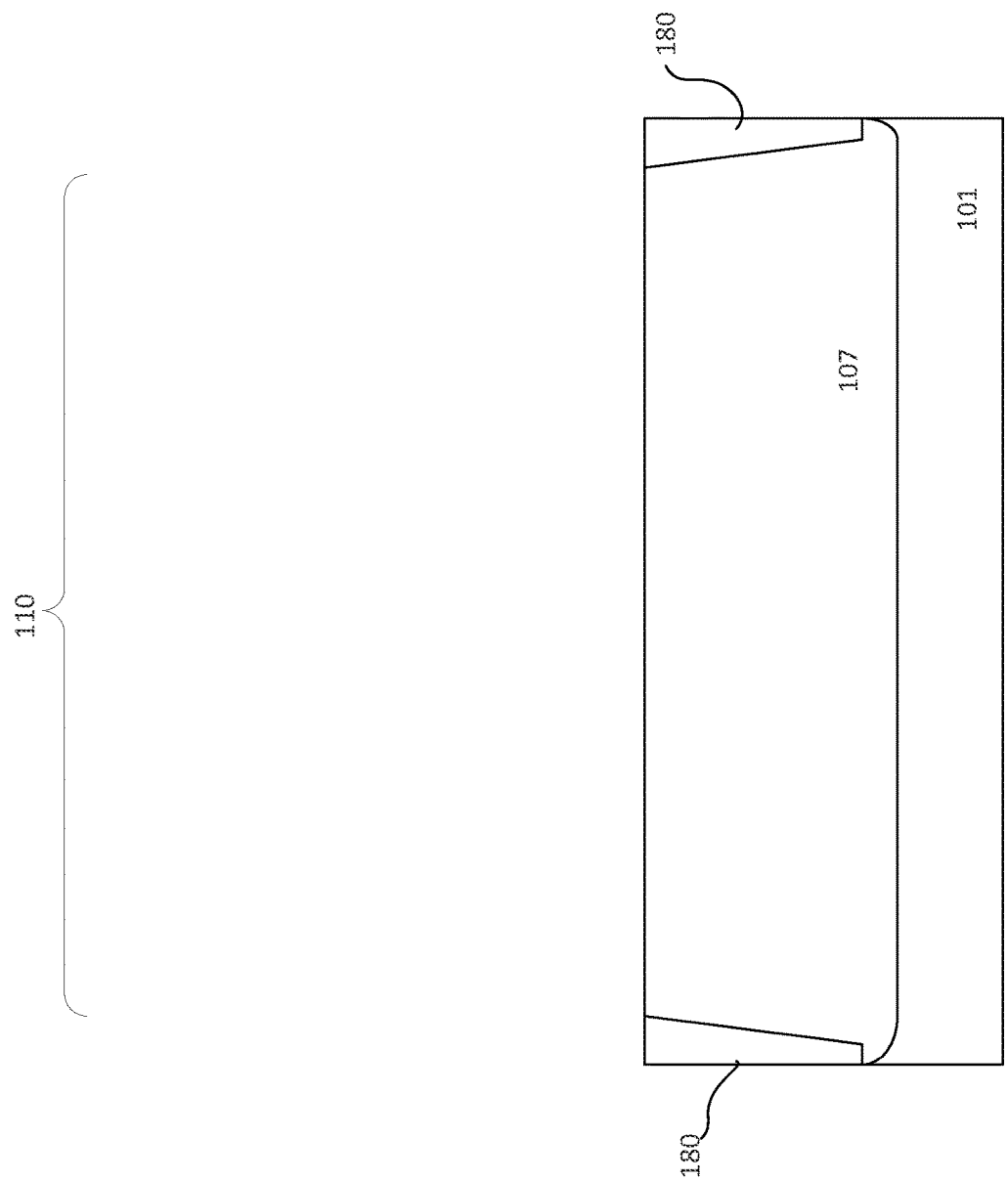

Referring to FIG. 2a, a substrate 101 is provided. The substrate, for example, is a silicon substrate. Other suitable types of substrates, such as silicon germanium, germanium, gallium arsenide, or crystal-on-insulator (COI) such as silicon-on-insulator (SOI), are also useful.

The substrate includes a device region 110. Although one device region is shown, it is understood that the substrate may include other device regions. Isolation regions 180 are formed in the substrate for isolating or separating different regions (not shown). The isolation regions, for example, are shallow trench isolation (STI) regions. Other suitable types of isolation regions may also be employed. Various conventional processes can be employed to form the STI regions. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The STI regions, for example, extend to a depth of about 2000-5000 Å. Forming isolation regions which extend to other depths may also be useful.

A device well 107 may be formed in the device region. The device well is formed within the isolation region. A depth of the device well may be about 0.5-5 μm. Other depths for the device well may also be useful. In one embodiment, the device well is doped with second polarity type dopants and serves as a body for a first polarity type device. For example, the device well may be doped with p-type dopants for a n-type device. Alternatively, the second polarity type dopants may be n-type. The dopant concentration of the device well may be light to intermediate. For example, the dopant concentration of the device wells may be about $5E12$-$5E13/cm^2$. Other suitable dopant concentration for the device well may also be useful.

The process continues to form at least a gate of a transistor. For illustration, the process continues to form gates of first and second transistors. As shown in FIG. 2b, a gate dielectric layer 232 is formed on the substrate. In one embodiment, the gate dielectric layer disposed on the substrate is silicon oxide. Other suitable types of gate dielectric layer, such as silicon oxynitride or high-k dielectric may also be useful. The thickness of the gate dielectric layer, for example, is about 10-1000 Å. Other suitable thickness dimensions may also be useful. The gate dielectric layer may be formed by, for example, thermal oxidation, chemical vapor deposition (CVD) or a combination thereof. Other suitable techniques for forming the gate dielectric layer may also be useful.

The process continues to form a gate electrode layer 236 on the substrate. The gate electrode layer, for example, may be a silicon layer. The silicon layer, for example, may be a polysilicon layer. The thickness of the gate electrode layer may be about 700-5000 Å. Other suitable thickness dimensions may also be useful. The gate electrode layer may be formed by, for example, CVD. Other suitable techniques for forming the gate electrode layer may also be useful. The gate electrode layer can be formed as an amorphous or non-amorphous layer. In the case of an amorphous layer, an anneal may be performed to form a polycrystalline silicon layer. Other configurations of gate dielectric and gate electrode layers may also be useful.

The gate dielectric and gate electrode layers are patterned to form gates of the first and second transistors. An etch mask (not shown), for example, may be employed to pattern the gate dielectric and gate electrode layers to form the gates. For example, a soft mask, such as a photoresist layer, may be used. An exposure source may selectively expose the photoresist layer through a reticle containing the desired pattern. After selectively exposing the photoresist layer, it is developed to form openings corresponding to locations where the gate dielectric and gate electrode layers are to be removed. To improve lithographic resolution, an anti-reflective coating (ARC) may be used below the photoresist layer. An anisotropic etch, such as RIE, is performed using the etch mask to pattern the gate dielectric and gate electrode layers. Other suitable types of etch processes may also be useful. As shown in FIG. 2c, the gates having the patterned gate dielectrics 132 and gate electrodes 136 are defined.

The process continues to form lightly doped diffusion (LDD) regions 142 in the substrate as shown in FIG. 2d. The LDD regions, for example, are formed by ion implantation. An implant mask (not shown), such as a photoresist, is formed over the substrate and is employed to define the LDD regions. To form first polarity type transistors, first polarity type dopants are implanted into the substrate to form the LDD regions. The LDD regions are disposed within the device well. For example, the LDD regions have a depth shallower than the device well. The LDD regions, for example, may extend from the top surface of the substrate to a depth of about 0.05-0.3 μm. Dopant concentration of the LDD regions may be about $1E11$-$1E13/cm^2$. Other suitable depths or dopant concentrations for the LDD regions may also be useful. The implant mask may be removed after forming the LDD regions. The implant mask may be removed by, for example, ashing. Other techniques for removing the implant mask may also be useful.

The process continues to form sidewall spacers 138 on sidewalls of the gates. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, about 50-500 Å. Other suitable thicknesses for the dielectric layer may also be useful. The thickness, for example, may depend on the desired width of the spacers. An anisotropic etch, such as RIE, may be performed to remove horizontal portions of the dielectric layer, leaving spacers 138 on the sidewalls of the gates as shown in FIG. 2e. In some applications, the spacers may be formed from multiple dielectric layers, such as a combination of silicon oxide and silicon nitride. Other suitable combination of dielectric layers may also be useful.

Figure 2F:
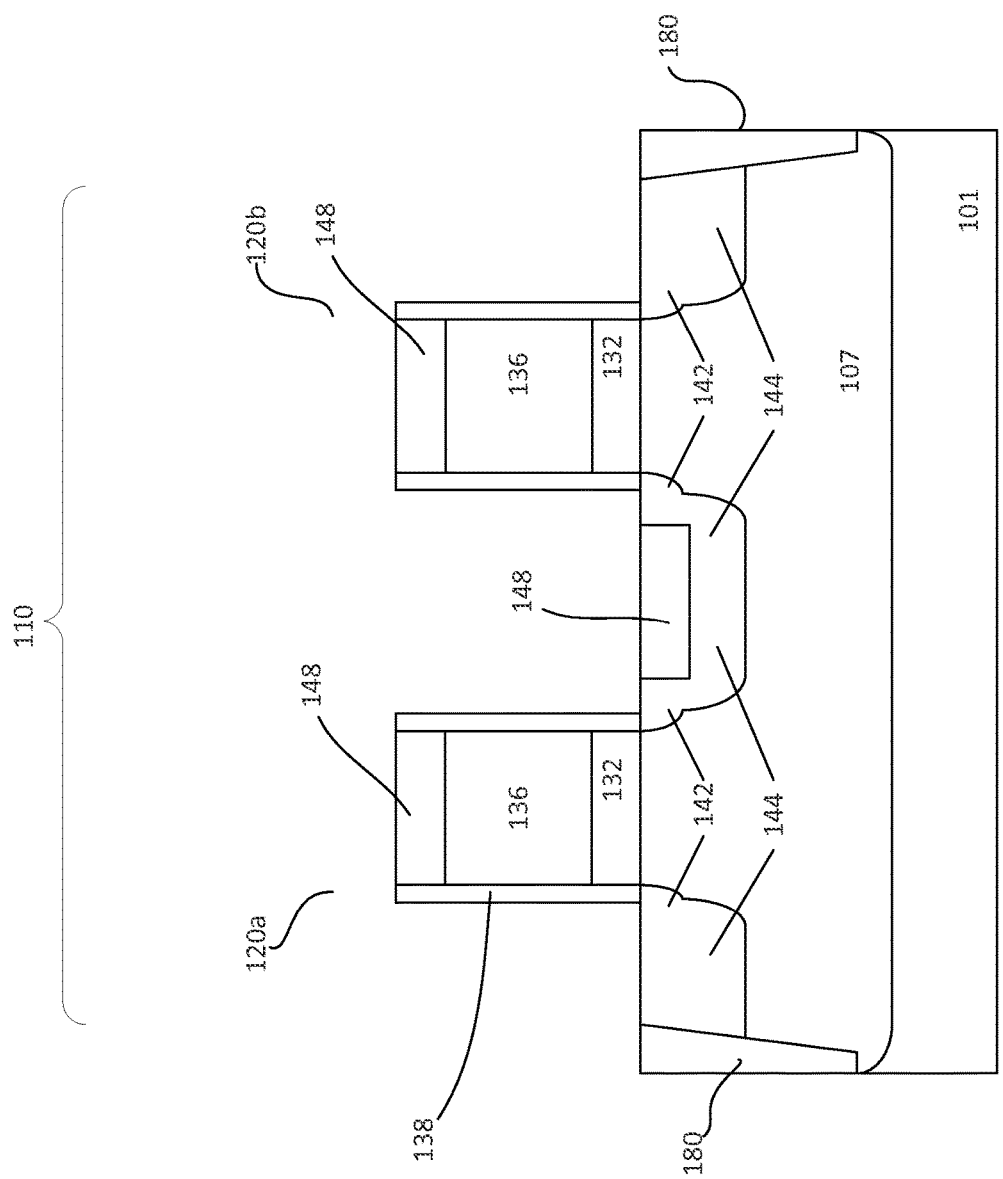

Referring to FIG. 2f, source/drain (S/D) regions are formed in the substrate adjacent to the gates. The S/D regions are heavily doped regions 144 having first polarity type dopants for first polarity type of transistors. The S/D regions are formed by an implantation process. The implant, for example, is performed using an implant mask (not shown), such as a photoresist mask. The implant mask exposes, for example, the device region. First polarity type dopants are implanted to form the heavily doped S/D regions. The S/D regions are self-aligned to the inner edges of isolation region 180 and outer edges of the sidewall spacers. The S/D regions have a depth shallower than the device well and deeper than the LDD regions. The S/D regions, for example, may extend from the top surface of the substrate to a depth of about 0.1-0.4 µm.

As shown, first S/D region is formed on a first side of the gate of the first transistor 120a and a second S/D region is formed on a second side of the gate of the first transistor while a first S/D region is formed on a first side of the gate of the second transistor 120b and a second S/D region is formed on a second side of the gate of the second transistor which is nearer to the first transistor. As shown, the first and second transistors share a common S/D region. For example, the second S/D region of the first transistor and the second S/D region of the second transistor are common S/D region. It is understood that the first and second transistors need not share a common S/D region.

After forming the S/D regions, the implant mask is removed. The implant mask may be removed by, for example, ashing. Other techniques for removing the implant mask may also be useful. An anneal, such as rapid thermal anneal (RTA), is performed after the implant to activate the dopants in the S/D and LDD regions.

The process may continue to form metal silicide contacts 148 on terminals or contact regions of the transistor as shown in FIG. 2f. For example, the metal silicide contacts are formed on the gate electrodes and S/D regions of the first and second transistors. The metal silicide contacts, for example, are nickel based metal silicide contacts. Other types of metal silicide contacts may also be useful. The metal silicide contacts are used to facilitate low resistance contacts between the active substrate and the BEOL metal lines disposed in metal level dielectric layers of the device. In one embodiment, the thickness of the silicide contacts is about 50-500 Å. Providing other suitable thicknesses may also be useful.

To form metal silicide contacts, a metal layer is deposited on the surface of the substrate. The metal layer, for example, may be nickel or an alloy thereof. Other types of metallic layers, such as cobalt, or alloys thereof, including nickel, may also be used. The metal layer may be formed by physical vapor deposition (PVD). Other suitable processes to form the metal layer may also be useful. An anneal is performed to initiate a reaction between the metal layer and the substrate, forming a silicide layer. For example, the metal layer reacts with the exposed silicon surfaces of the gate electrodes and S/D regions, forming silicide contacts. Metal layer disposed over non-silicon material are not reacted. Unreacted metal is removed by, for example, a wet removal process. For example, unreacted metal material is removed selective to the silicide contacts. Other techniques for forming the silicide contacts may also be useful.

Figure 2G:
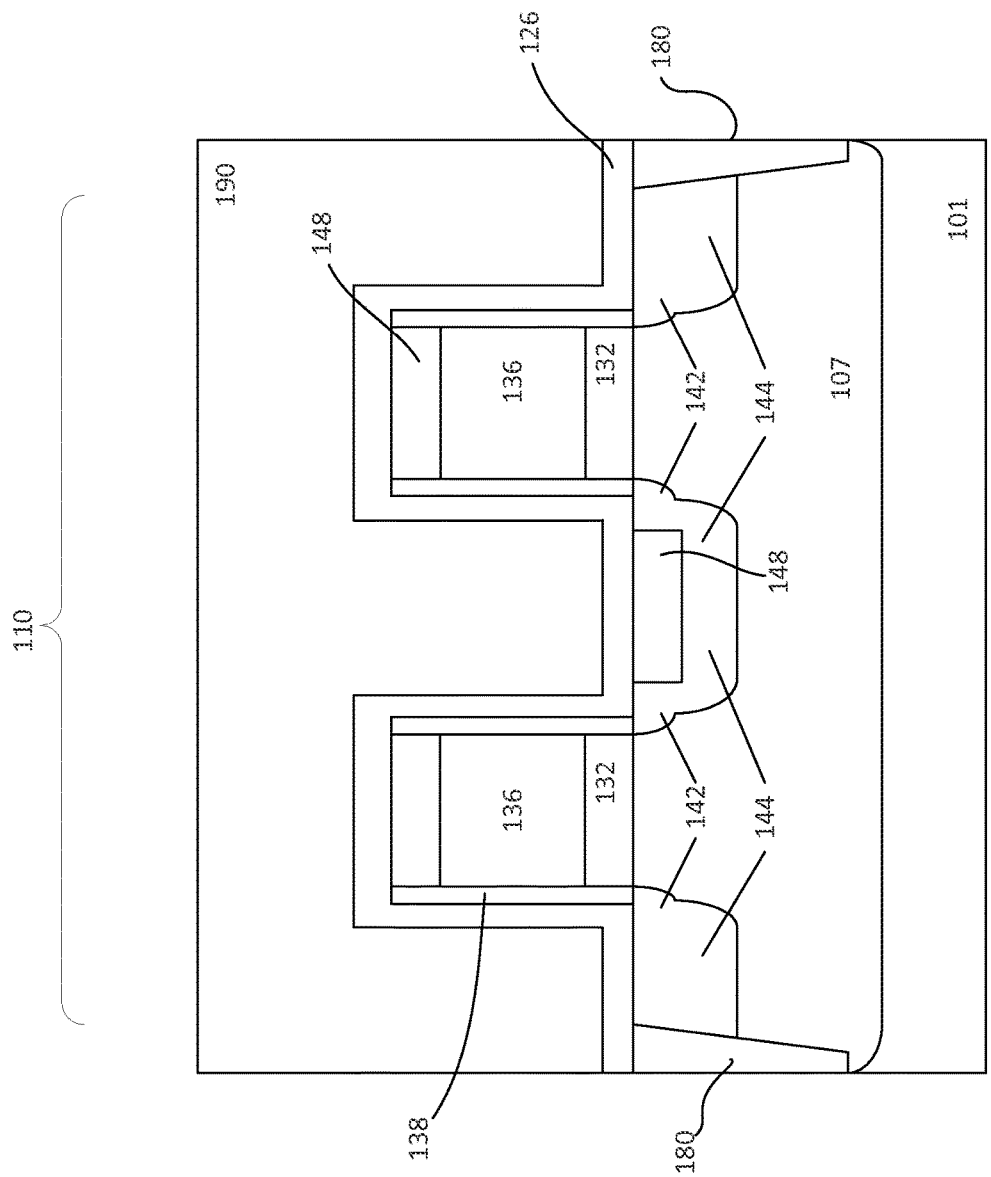

In FIG. 2g, a dielectric etch stop layer 126 is formed on the substrate, lining the substrate and gates of the transistors. The etch stop layer, for example, is a silicon nitride etch stop layer. Other suitable types of etch stop layer may also be useful. For example, any type of dielectric layer which can be removed selectively to the substrate below it may also be useful. The etch stop layer may be formed by, for example, CVD. Other techniques for forming the etch stop layer may also be useful. The etch stop layer may be, for example, about 100-1000 Å. Other thicknesses may also be useful. The etch stop layer, for example, may also serve as a stress layer.

Referring to FIG. 2g, a contact dielectric layer or a pre-metal dielectric (PMD) layer 190 is deposited on the substrate. For example, the contact dielectric layer is formed on the etch stop layer 126. The contact dielectric layer is formed over the substrate by, for example, CVD process, preferably with high gap fill capabilities. Other suitable types of techniques for forming the contact dielectric layer may also be useful. The contact dielectric layer, for example, serves as the first contact or CA level. The contact dielectric layer should be sufficiently thick to accommodate contacts. The contact dielectric layer includes a thickness of about 2000-10000 Å. The thickness of the contact dielectric layer varies, for example, depending on the technology node and design requirements.

The contact dielectric layer, for example, may include an oxide material. For example, the contact dielectric layer may include $SiO_2$. Other suitable types of dielectric materials including doped silicon oxide such as fluorinated silicon oxide (FSG), undoped or doped silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials can also be used to form the contact dielectric layer. The contact dielectric layer should have a material which can be selectively removed from the etch stop layer below it.

Figure 2H:
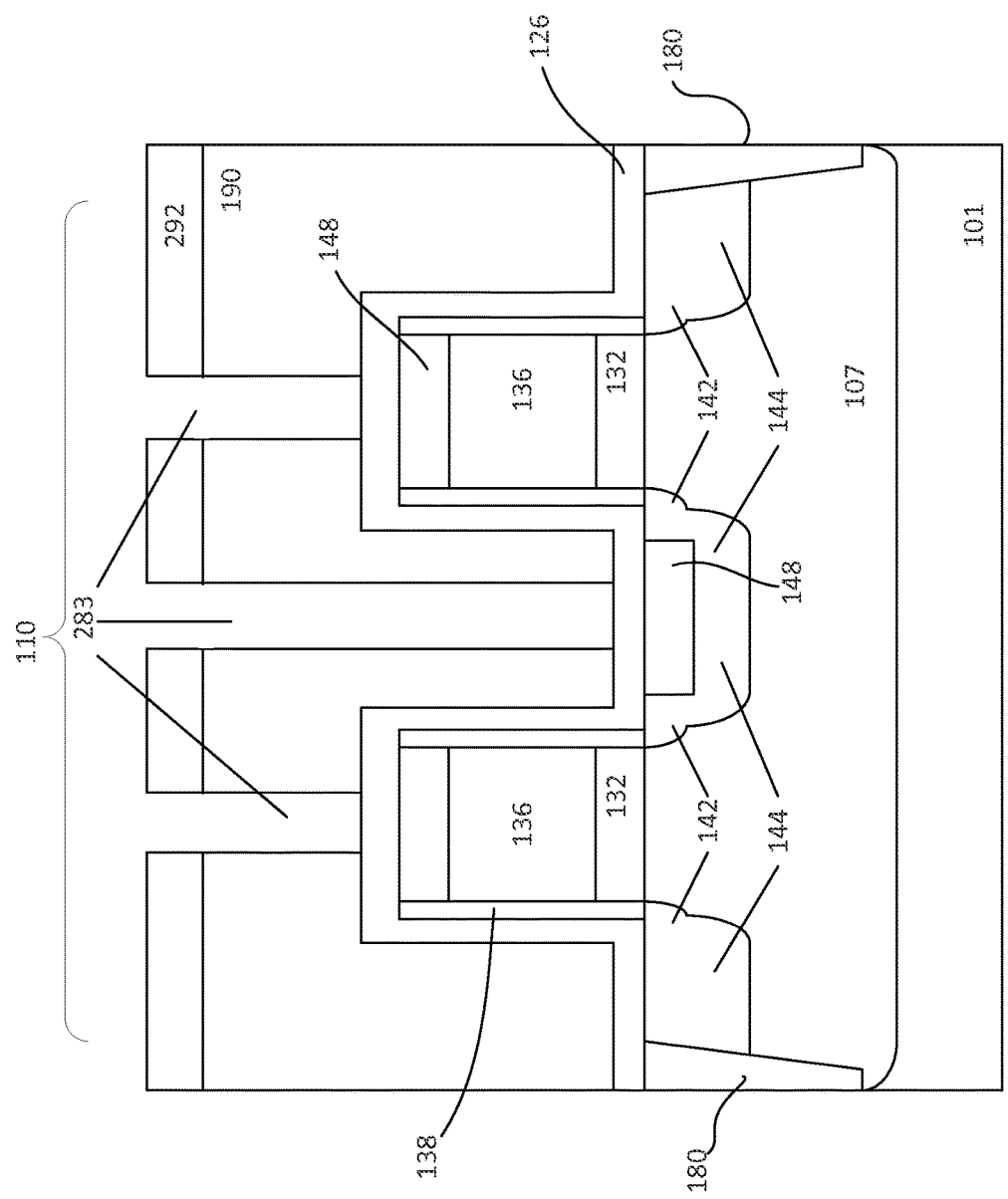

The process continues by forming conductive contacts. Referring to FIG. 2h, a mask layer 292 is formed over the top surface of the contact dielectric layer 190a. The mask layer, for example, includes a single layer photoresist with bottom anti-reflection coating (BARC). Alternatively, the mask layer 292 may be a bi- or tri-layer mask stack such as photoresist/Si-containing anti-reflection coating (SiARC)/ organic dielectric layer (ODL), photoresist/dielectric anti-reflection coating (DARC)/Advanced Patterning Film (APF), etc. Other suitable organic or dielectric materials may also be useful. The total thickness of the mask layer, for example, is about 1000-5000 Å. The mask layer may be formed by, for example, lithography or CVD. Other suitable configurations of the mask layer, including thicknesses and types, may also be useful.

In FIG. 2h, the mask layer is patterned to form openings corresponding to the contact regions. The openings, for example, are contact or via openings which correspond to contact regions of the transistors. Patterning the mask layer may be achieved by exposing it with an exposure source through a reticle, or dry plasma etch (dry development). The mask layer is developed, transferring the pattern of the reticle to the contact dielectric layer. The openings of the mask layer expose regions of the contact dielectric layer to be removed in subsequent process.

The process continues to remove portions of the contact dielectric layer which are exposed by the openings of the mask layer. In one embodiment, the contact dielectric layer is etched to form contact openings 283. The contact dielectric layer is etched selective to the etch stop layer 126. In one embodiment, the etch stops at the etch stop layer. The etch, for example, forms contact openings with about vertical sidewalls throughout its depth from the top surface of the contact dielectric layer as shown in FIG. 2h. For example, the etch parameters are selected to form vertical or substantially vertical sidewalls. The etch, for example, includes any $C_xF_y$ etch chemistries. Any suitable etch chemistries may be used depending on the material of the contact dielectric layer.

Figure 2I:
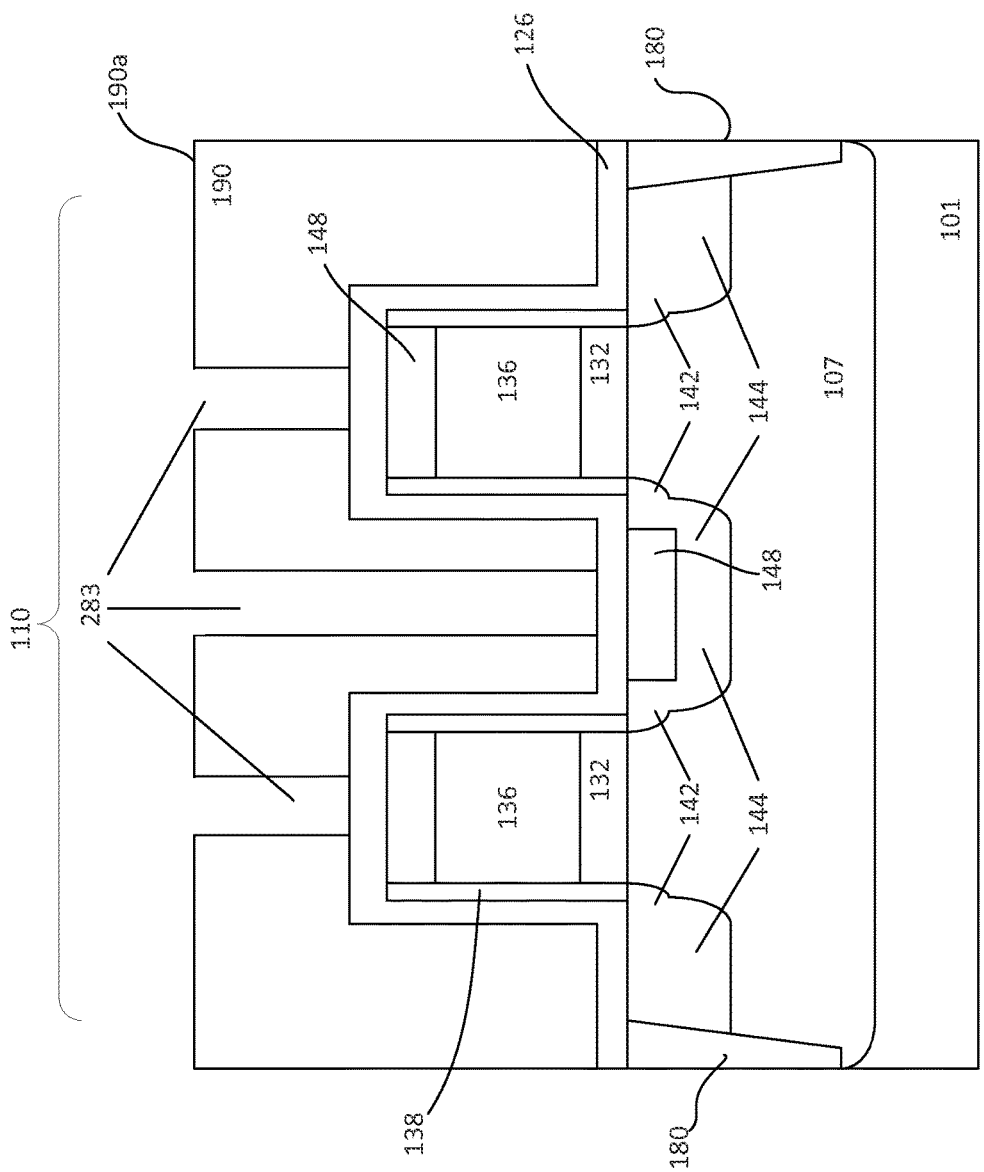

In one embodiment, the mask layer 292 is removed after forming the contact openings 283 in the contact dielectric layer as shown in FIG. 2i. The mask layer is removed by, for example, ashing. As shown, the removal of the mask layer exposes top surfaces of the contact dielectric layer and contact openings having the same width throughout the depth of the contact openings. The ashing process, for example, employs $O_2$ chemistries with $O_2$ flow rate of about 200-1000 sccm, top RF power of about 0-1000 W, bottom RF power of about 0-500 W and pressure of about 30-100 mTorr. Other suitable process parameters may also be used to remove the mask layer. The ashing process, in one embodiment, is performed in the same chamber used for etching the contact dielectric layer.

Figure 2J:
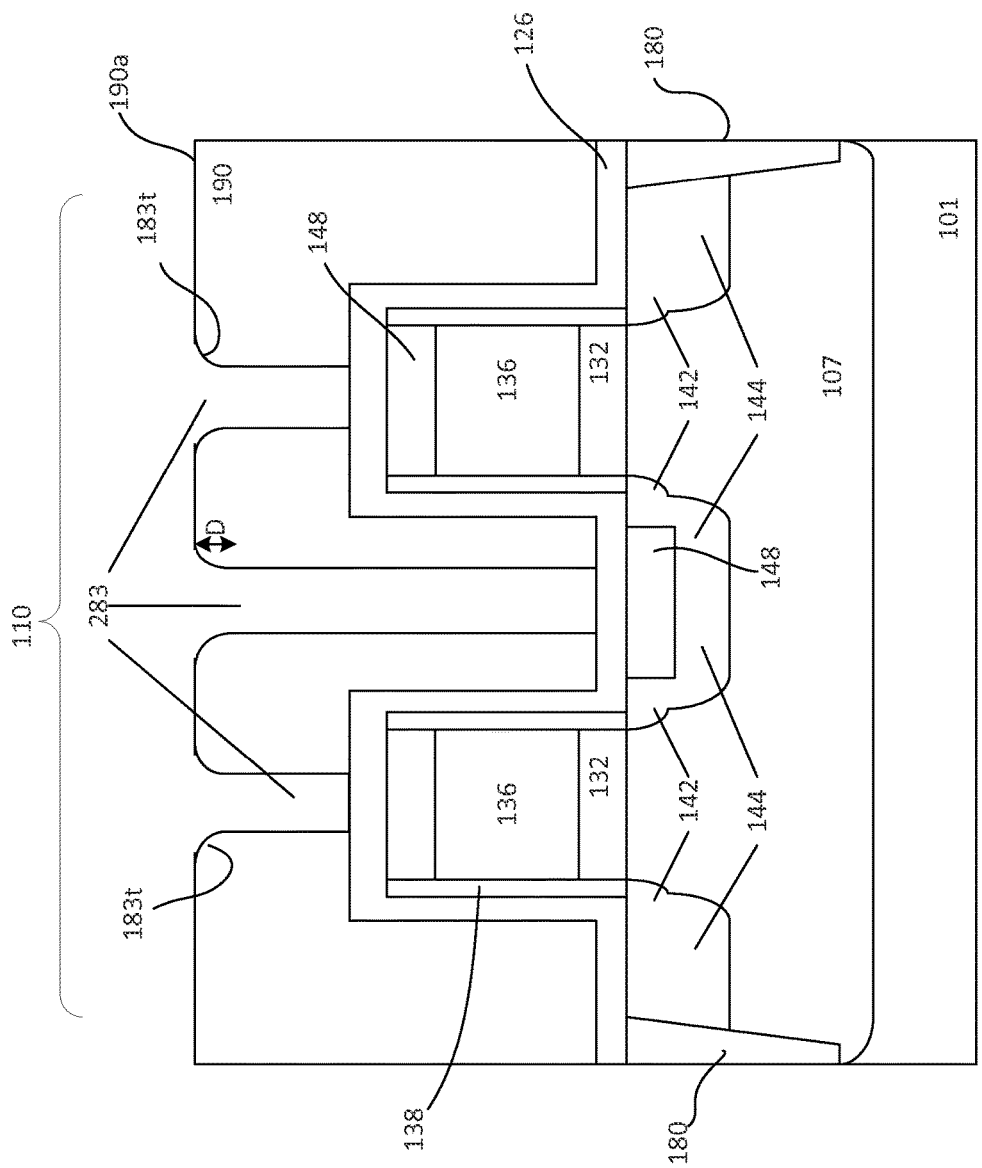

In one embodiment, an etch back process is performed to remove upper portions of the contact openings such that the upper portion 183t of the upper contact opening is larger than the lower portion as shown in FIG. 2j. The etch back process, in one embodiment, includes an $O_2$ etch back process. The etch back process, for example, employs $O_2$ chemistries with $O_2$ flow rate of about 200-1000 sccm, top RF power of about 0-300 W, bottom RF power of about 600-1000 W and pressure of about 20-30 mTorr. Other suitable process parameters may also be useful. The etch back process, for example, includes sputtering and is configured such that faster removal rate is achieved at the top corner of the contact opening, resulting in tapered sidewall profile which leads to wider opening in the upper portion of the contact opening. The width of the upper portion of the contact opening, for example, is about 50-200% wider than the width of the lower portion of the contact opening. Other suitable width dimensions may also be useful. The upper portion having wider opening includes a depth (D) of about, for example, 10-30% of the total depth of the contact opening from the top surface of the contact dielectric layer. Other suitable depth dimensions may also be useful for the upper portion. As shown in FIG. 2j, the sidewall profile of the lower portion of the contact openings remains substantially vertical and unchanged. Other suitable etch back process may also be useful.

In one embodiment, the etch back process to form the contact opening having tapered sidewall profile in the upper portion is performed as a separate process step after removing the mask layer. In an alternate embodiment, the etch back process is integrated into the mask layer removal or stripping process. For example, the $O_2$ etch back process is integrated into the last step of the ashing process to remove the mask layer. Since the $O_2$ etch back process employs the same process gas as the ashing process to remove the mask layer, the profile tapering can be combined with in-situ mask layer stripping process. In such case, the same ashing process which is used to remove the mask layer will also consume part of the upper portion of the contact opening to form the profile as shown in FIG. 2j.

Figure 2K:
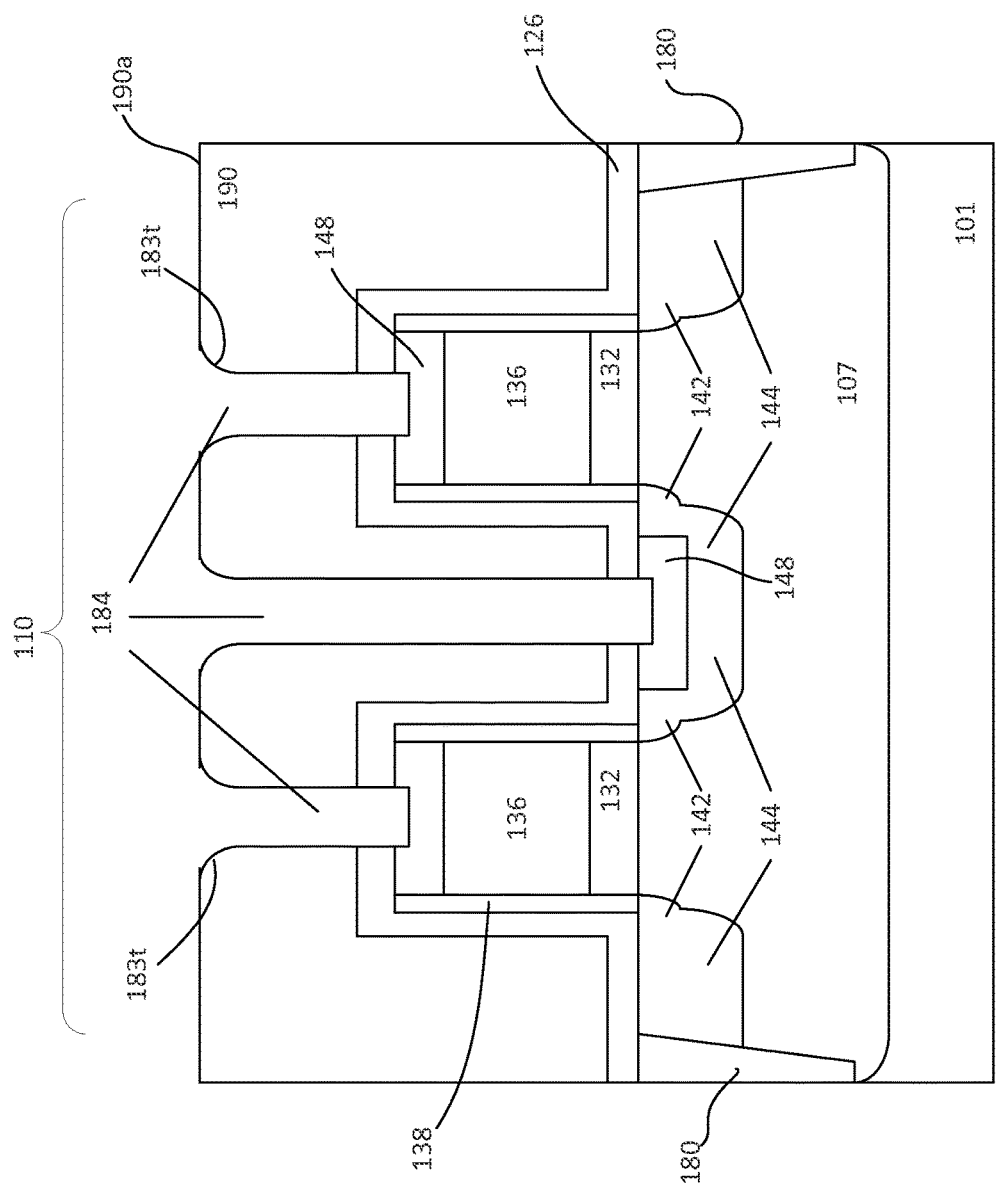
Figure 21:
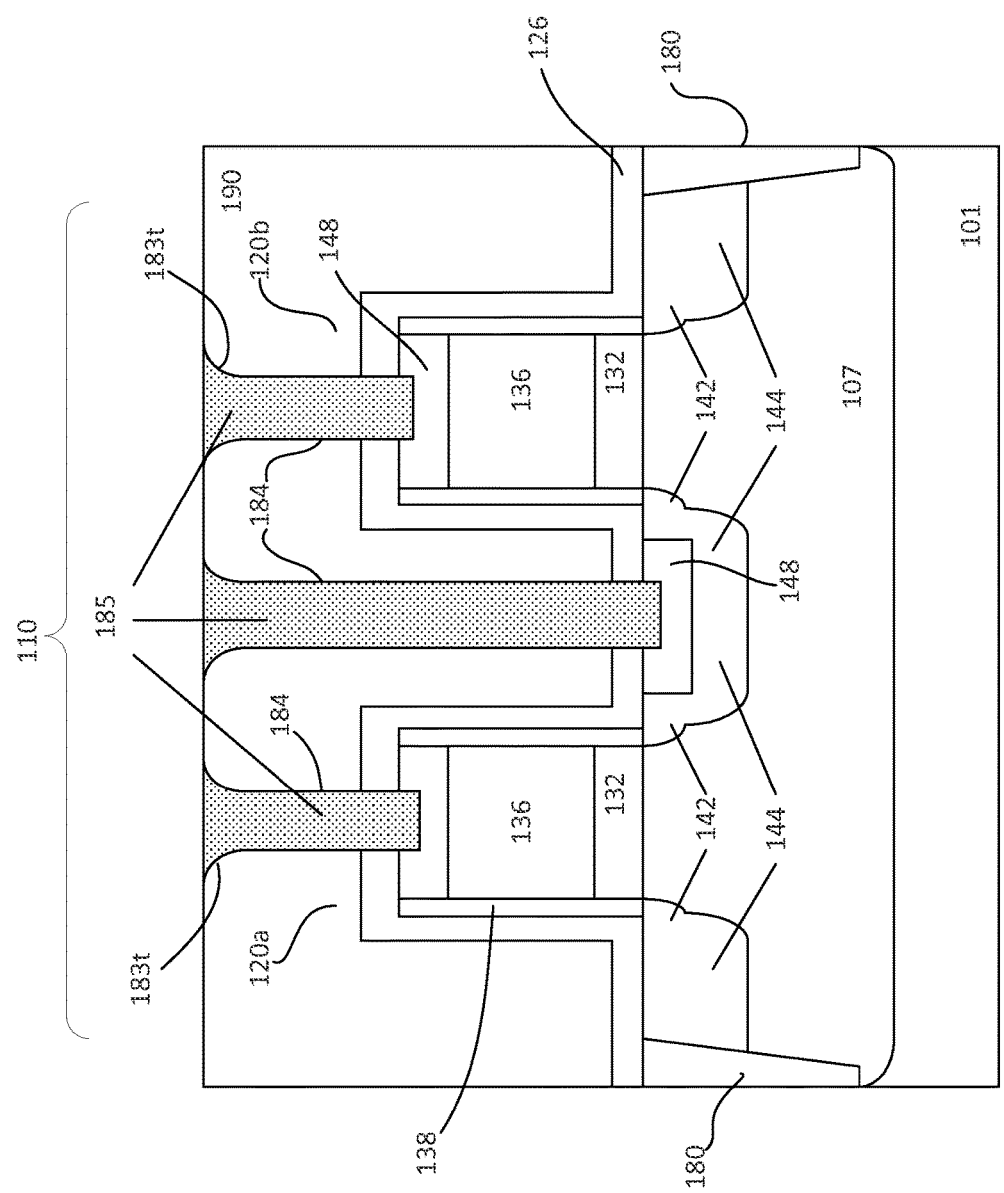

The process continues to remove portions of the etch stop layer which is exposed by the contact openings as shown in FIG. 2k. In one embodiment, an etch is performed to remove the etch stop layer. The etch, for example is highly selective to the etch stop layer. For example, the etch to remove the etch stop layer includes $CF_4$ or $C_xH_yF_z$ (where x, y, z from 1-3) etch chemistries. Other suitable etch chemistries may be employed, depending on the materials of the etch stop layer. The etch, for example, stops at the top surface of the metal silicide contacts. In some instances, the etch may slightly consume part of the metal silicide contact, resulting in the contact openings 184 having a bottom which is lower than top surface of the metal silicide contacts.

As described, the contact openings include upper and lower portions having different sidewall profiles. For example, the upper portion of the contact openings 183t includes a tapered sidewall profile that is wider than the lower portion of the contact opening having vertical sidewall profile.

Referring to FIG. 2l, contacts 185 are formed in the contact openings. The contacts are formed by, for example, forming a conductive layer in the substrate, filling the contact openings and covering the contact dielectric layer. For example, the conductive layer is formed by CVD. Other suitable techniques may be used to form the conductive contacts. Liners (not shown) may be formed lining the contact openings prior to filling them with conductive material. The liners, for example, include TiN, TaN or a combination thereof. The liner, for example, serves as a barrier to prevent diffusion of the conductive material of the contacts into the contact dielectric layer. Other suitable types of liner materials may also be useful, depending on the conductive materials of the contacts. The conductive layer, for example, is tungsten. Other suitable types of conductive materials, such as copper, aluminum, or conductive alloys, may also be used to fill the contact openings. Excess conductive material may be removed by, for example, CMP. In one embodiment, the CMP removes excess conductive material. This forms a planar top surface between the contacts and contact dielectric layer as shown in FIG. 2l.

The process continues to complete the formation of the device. The processing may include BEOL processing steps. For example, the BEOL processing includes forming metal layers for interconnect levels, final passivation, dicing, assembly and packaging. Other processes may also be included. For example, other components, such as low voltage, medium voltage, and high voltage I/O devices can be formed prior to forming the interconnections.

The process as described above results in advantages. The process as described in FIGS. 2a-2l is a flexible process and is easily implemented in existing or future semiconductor manufacturing processes. For example, as described, the etch back process to form the contact openings with upper and lower portions having different sidewall profiles as shown in FIG. 2j can be performed as a separate process or can be performed in-situ with the mask layer removal process. The configuration of the contact opening as shown in FIG. 2j facilitates gap fill and effectively prevents issues such as tungsten seam which may result in contact open. Thus, reliability of the device is assured and the device failure is avoided. Furthermore, the bottom sidewall profile of the contact openings remains substantially vertical and unaffected. Thus, there is no critical dimension (CD) loss. In addition, the etch back process is performed prior to the removal of exposed portions of the etch stop layer. Since the etch stop layer remains intact during the etch back process, the underlying metal silicide contacts will not be damaged by the etch back process. As such, post etch stop layer removal treatment is not needed. Moreover, there is also no negative impact on the process window since the tuning of the etch processes on contact dielectric and etch stop layers are not necessary.

The embodiments as described may be implemented in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
    providing a substrate having a device component with a contact region;
    forming a conformal etch stop layer on the substrate, wherein the etch stop layer covers sidewalls and a top surface of the device component and substrate;
    forming a contact dielectric layer on the substrate, wherein the contact dielectric layer covers the substrate and etch stop layer; and
    forming at least one contact opening through the contact dielectric layer, wherein upper portion of the contact opening includes wider opening with tapered sidewall profile while lower portion of the contact opening includes narrower opening with vertical sidewall profile, wherein forming the at least one contact opening comprises:
        providing a patterned mask layer over the contact dielectric layer, wherein the patterned mask layer comprises at least one opening corresponding to the contact region,
        removing portions of the contact dielectric layer exposed by the opening of the mask layer to form the at least one contact opening extending from a top surface to a bottom surface of the contact dielectric layer, the at least one contact opening having an initial vertical sidewall profile throughout its depth from the top surface of the contact dielectric layer, and
        integrating an etch back process with a mask layer removal process, wherein the mask layer removal process removes the patterned mask layer and the etch back process removes upper portion of the contact opening such that the upper portion of the contact opening includes wider opening with tapered sidewall profile.

2. The method of claim 1 wherein portions of the contact dielectric layer is removed by performing an etch process using $C_xF_y$ etch chemistries.

3. The method of claim 1 wherein the mask layer removal process and etch back process comprise an ashing process.

4. The method of claim 3 wherein the ashing process are performed using $O_2$ chemistries with $O_2$ flow rate of about 200-1000 sccm, top RF power of about 0-1000 W, bottom RF power of about 0-500 W and pressure of about 30-100 mTorr.

5. The method of claim 1 wherein the upper portion of the contact opening comprises a width which is about 50-200% wider than a width of the lower portion of the contact opening.

6. The method of claim 5 wherein the upper portion of the contact opening having wider opening includes a depth of about 10-30% of the total depth of the contact opening from a top surface of the contact dielectric layer.

7. The method of claim 1 wherein removing portions of the contact dielectric layer comprises etching the exposed portions of the contact dielectric layer selective to the etch stop layer.

8. The method of claim 1 wherein the etch stop layer is provided in between the substrate, the etch stop layer is in direct contact with the sidewalls and the top surface of the device component and substrate and a portion of the etch stop which is exposed by the contact opening is removed.

9. The method of claim 8 wherein the exposed etch stop layer is removed after performing the etch back process with the in-situ mask layer removal process.

10. The method of claim 9 wherein the exposed etch stop layer is removed by selective etching.

11. The method of claim 1 further comprising forming a contact in the at least one contact opening.

12. The method of claim 11 wherein forming the contact in the at least one contact opening comprises filling the at least one contact with a conductive material.

13. A method of forming a device comprising:
    providing a substrate prepared with a transistor having at least one contact region, wherein the transistor comprises a gate and sidewalls;
    forming a conformal etch stop layer on the substrate, wherein the etch stop layer covers sidewalls of the transistor, a top surface of the gate and substrate;
    forming a contact dielectric layer on the substrate, wherein the contact dielectric layer covers the substrate and etch stop layer; and
    forming at least one contact opening through the contact dielectric layer, wherein upper portion of the contact opening includes wider opening with tapered sidewall profile while lower portion of the contact opening includes narrower opening with vertical sidewall profile, wherein forming at least one contact opening comprises:
        providing a patterned mask layer over the contact dielectric layer, wherein the patterned mask layer comprises at least one opening corresponding to the contact region,
        removing portions of the contact dielectric layer exposed by the opening of the mask layer to form the at least one contact opening extending from a top surface to a bottom surface of the contact dielectric layer, the at least one contact opening having an initial vertical sidewall profile throughout its depth from the top surface of the contact dielectric layer, and
        integrating an etch back process with a mask layer removal process, wherein the mask layer removal process removes the patterned mask layer and the etch back process removes upper portion of the contact opening such that the upper portion of the contact opening includes wider opening with tapered sidewall profile.

14. The method of claim 13 wherein the etch stop layer is provided in between the substrate and the contact dielectric layer, the etch stop layer is in direct contact with the sidewalls and the top surface of the device component and substrate and a portion of the etch stop which is exposed by the contact opening is removed.

15. The method of claim 13 wherein portions of the contact dielectric layer is removed by performing an etch process selective to the etch stop layer.

16. The method of claim 14 wherein removing portions of the contact dielectric layer comprises etching the exposed portions of the contact dielectric layer selective to the etch stop layer.

17. The method of claim 14 wherein the exposed portion of the etch stop layer is removed after the removal of the patterned mask layer and upper portion of the contact opening.

18. The method of claim 17 wherein the exposed etch stop layer is removed by selective etching.

19. The method of claim 14 further comprising forming a contact in the at least one contact opening.

20. The method of claim 19 wherein forming the contact in the at least one contact opening comprises filling the at least one contact with a conductive material.

* * * * *